(12) United States Patent
Ruben

(10) Patent No.: US 6,717,100 B2
(45) Date of Patent: Apr. 6, 2004

(54) APPARATUS AND METHOD FOR LASER WELDING OF RIBBONS

(75) Inventor: David A. Ruben, Mesa, AZ (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 10/280,965

(22) Filed: Oct. 25, 2002

(65) Prior Publication Data

US 2003/0127434 A1 Jul. 10, 2003

Related U.S. Application Data

(62) Division of application No. 09/688,427, filed on Oct. 16, 2000, now Pat. No. 6,501,043.
(60) Provisional application No. 60/161,163, filed on Oct. 22, 1999.

(51) Int. Cl.[7] ............................... B23K 26/20
(52) U.S. Cl. ............... 219/121.64; 219/121.63
(58) Field of Search ................ 219/121.63, 121.64

(56) References Cited

U.S. PATENT DOCUMENTS

| | | |
|---|---|---|
| 4,697,061 A | 9/1987 | Spater et al. |
| 4,845,354 A | 7/1989 | Gupta et al. |
| 4,893,742 A | 1/1990 | Bullock |
| 5,452,841 A | 9/1995 | Sibata et al. |
| 5,522,861 A | 6/1996 | Sikorski et al. |
| 5,535,097 A | 7/1996 | Ruben et al. |
| 6,501,043 B1 * | 12/2002 | Ruben .................. 219/121.64 |

FOREIGN PATENT DOCUMENTS

| | | |
|---|---|---|
| JP | 358089831 A | 5/1983 |
| JP | 362006789 A | 1/1987 |
| JP | 362210633 A | 9/1987 |
| JP | 403220741 A | 9/1991 |

* cited by examiner

*Primary Examiner*—Geoffrey S Evans
(74) *Attorney, Agent, or Firm*—Girma Wolde-Michael; Paul H. McDowall

(57) ABSTRACT

An apparatus and method are provided for using laser energy in an automated bonding machine to effect laser welding of ribbons and other connectors, particularly conductive ribbons in microelectronic circuits. The apparatus and method allow bonding and connection of microelectronic circuits with discrete heating avoiding heat damage to peripheral microelectronic components. The apparatus and method also allow bonding of flexible materials and low-resistance materials, and are less dependant on substrate and terminal stability in comparison to existing bonding methods. The bonding method leads to decreased apparatus wear in comparison to existing bonding methods.

21 Claims, 4 Drawing Sheets

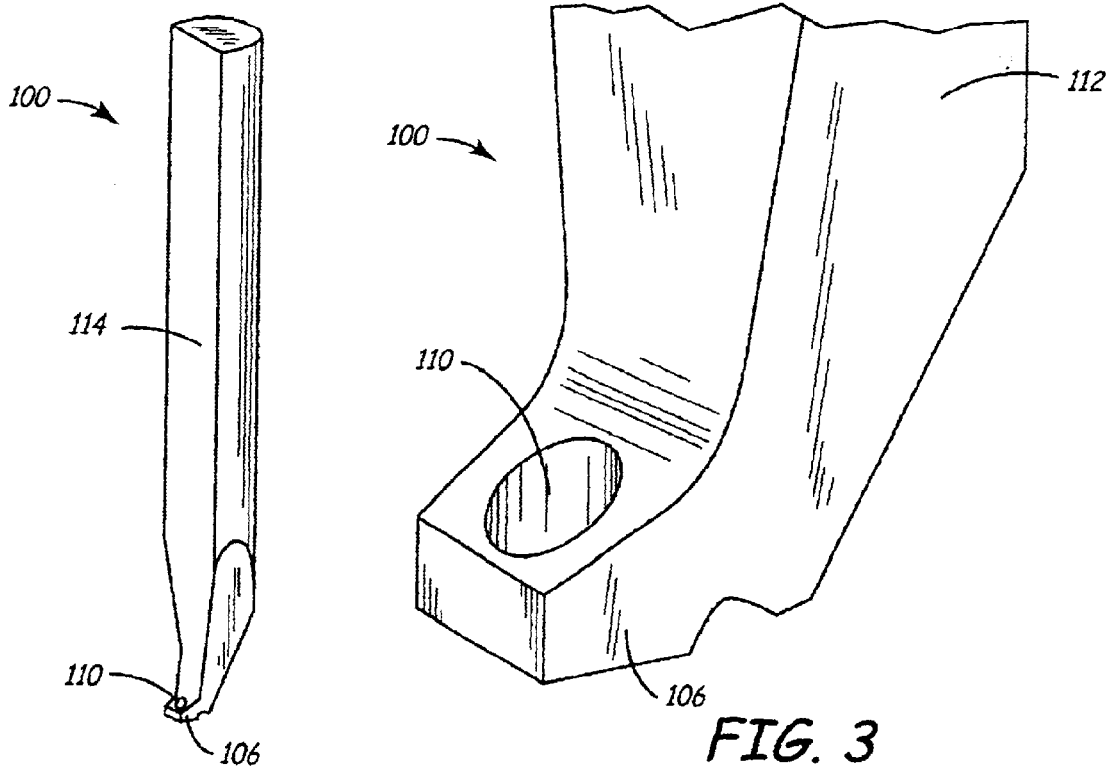
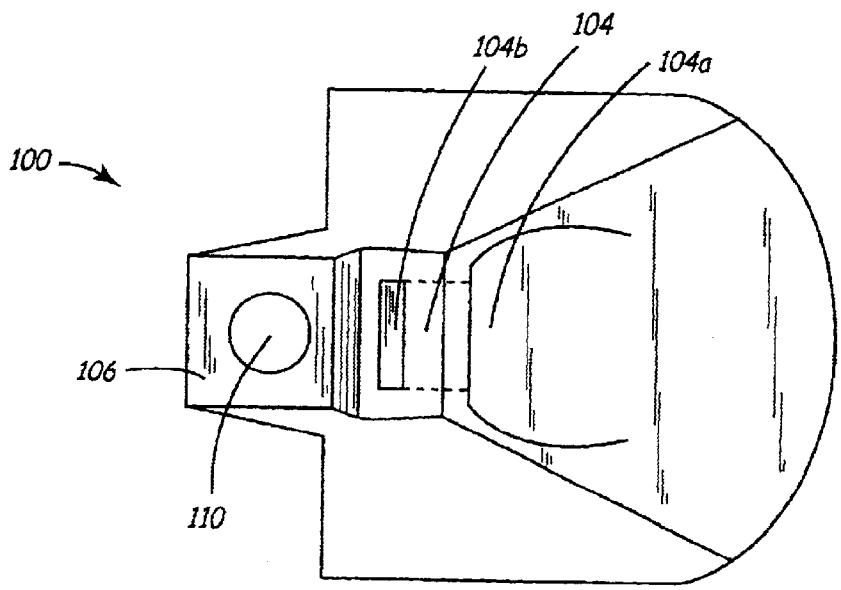

APPARATUS AND METHOD FOR LASER WELDING OF RIBBONS

CROSS-REFERENCE TO RELATED APPLICATIONS

This patent is a divisional of U.S. patent application Ser. No. 09/688,427 filed Oct. 16, 2000, now U.S. Pat. No. 6,501,043, and claims the benefit of U.S. Provisional Application No. 60/161,103, filed Oct. 22, 1999.

FIELD OF THE INVENTION

The present invention relates to methods and apparatus for joining connective members, especially conductive members to join electronic and microelectronic circuits.

BACKGROUND

Electronic circuits, such as microelectronic logic circuits, or other similar electronic circuits, may be fabricated as an integrated unit, which has developed to a highly efficient method of compact circuit manufacture. Ultimately, however, the integrated circuit components or other packaged electronics must be connected to larger circuits in order to be utilized, and be interconnected via lead frames or other connectors with circuits such as input and display apparatus, power supplies and grounds, and complementary circuits. Given the small scale of such circuits, the connection of these circuits also takes place on a relatively small scale. For example, integrated circuit chips are typically less than 0.3 inches×0.3 inches. These circuits may be interconnected by very small wires, e.g. wires with a one mil diameter, or by small, flat conductive metal ribbons which may be, for example, 1×10 mils (0.001 inches×0.01 inches).

Generally, metals for electronic connections may be joined by soldering, i.e., by the melting of an alloy or element with a relatively low melting temperature, where neither base material of the joined members is melted or becomes part of the joint. Welding, in contrast, involves the melting of the base members to be joined, resulting in the formation of a weld nugget consisting of material from both of the elements to be joined, in other words, a fusion or thorough and complete mixing between the two edges of the base metal to be joined.

While heat is often used to join wires or other conductors together, both for solid-state, fusion, and solder/brazing applications, many traditional methods of heating have proved to have drawbacks in microelectronic applications. One method of applying heat to a bonding site has involved heating the bonding head to convey heat to the bonding site. In an alternate method, a heater block may be clamped to a circuit lead frame. However, heat applied to these structures, which are large relative to the area to be bonded, may cause distortion or bending of the lead frame, or damage to other electrical components. If heat is to be used to solder microelectronic connectors, it would be desirable to more precisely localize this heat on the leads or connectors to be soldered, rather than heating an area as large as, for example, an entire lead frame.

As an alternative to soldering using heat alone, ribbon bonders of the prior art have used specialized solid-state bonding methods, e.g., ultrasonic energy, to bond the ribbons to substrates, lead frames, or various electronic components. Ultrasonic energy, a high-frequency vibration, e.g. from 60 KHz to over 100 KHz, is imparted to the parts to be bonded by a bond head. This vibration, and the attendant abrasion of the connector against the terminal pad or lead, in conjunction with heat and mechanical pressure from the bonding head, effects metallurgical atomic diffusion bonding of the connector with the metal of the bonding sites. Modern ultrasonic bonding machines conveniently employ optics and pattern-matching logic systems in order to automate the bonding process for a particular package or circuit being assembled.

Ultrasonic ribbon bonding is primarily employed as a method of connecting integrated circuits, packages or substrates in high frequency or high power applications. Ultrasonic bonding techniques, however, have several drawbacks which motivate a reduced reliance on such techniques. Ultrasonic or thermosonic bonding, i.e. ultrasonic vibration using heat, may find application in bonding flat, rigid structures but is not well suited to bonding less rigid, i.e., flexible or semi-flexible structures. Such structures tend to vibrate in response to the ultrasonic energy causing much of the energy to be lost rather than creating the intended bond. Another drawback of ultrasonic bonding is that it may be used primarily with certain materials, and is generally limited to gold, aluminum and copper. Accordingly, the substrate metal to be bonded is generally gold plated.

Because the ultrasonic energy is, in fact, a vibration, albeit a very high-frequency one, this vibration may cause undesired movement of the parts to be joined during the bonding process. Not only can this lead to dislocation of the parts vis-a-vis each other, but the movement of the parts during the time when bonding is being effected naturally results in a weaker and inconsistent bond. These problems present substantial vibrational stability requirements for the terminals and substrates used in ultrasonic bonding. In light of the limitations of ultrasonic bonding, an alternative method of bonding conductors for microelectronic devices would be desirable.

Resistance welding has enjoyed limited application in microelectronics manufacture. To varying extents, metallic objects resist the flow of electrical current. This resistance will cause heat energy as electric current passes through the metals to be bonded. The higher the amperage and duration of current, the greater the heat energy that will be produced. Metallic objects have thermal properties, a melting point, a specific heat content, thermal conductivity, and more. By using these properties, an environment can be created to produce a molten pool that will harden into a welding nugget. However, the application of resistance welding is limited, and is generally incompatible with low resistance ribbon materials such as copper, silver and gold.

Laser-generated heat has found application in certain part-joining methods. For example, lead frames have been soldered with lasers in applications such as TAB (Tape Automated Bonding), utilized, for example, in U.S. Pat. No. 4,893,742 to Bullock. TAB bonding, however, is subject to a number of limitations, chief among them that dedicated and expensive equipment is necessary for each process step. The interconnecting ribbons or leadframes must be formed ahead of time. Therefore, the specially designed tape carriers for each type of circuit being produced involve long lead time and high cost. Dedicated tooling is required to excise and form TAB leads. "Bumping", i.e., the placement of small metal bumps on the circuit bond sites in order to provide a bonding surface above the circuit's passivation layer, is required. In addition, the leadframes must be placed and held precisely in position before soldering. Finally, the leads to be bonded with existing apparatus and methods require solder to effect bonding—the main body of the lead and connectors do not reach a melting point, and only the solder is softened. TAB leads are accordingly coated with solder at some point prior to the bonding process. Therefore, considerable advance preparation of the TAB leadframes is required. In general, characterizing the behavior of individual designs and structures is very time-consuming, as is the construction of lead frame tapes for TAB production methods.

It would be desirable to provide laser bonding which could be effected using devices similar to traditional wedge bonding equipment, which may automatically bond individual contact points, without the preparation required for tape-mounted lead frames. It would also be desirable to provide a bonding method that would work on a variety of materials, including low-resistance metals, without the use of solder. In addition, it would be desirable to provide a bonding technique that utilizes a highly localized heating area, without peripheral heating of lead frames or other components adjacent the bond site. Finally, it would be desirable to have a bonding method capable of bonding flexible materials that may tend to vibrate in response to the application of ultrasonic energy.

SUMMARY OF THE INVENTION

Difficulties with existing systems of connector fabrication are overcome with a device providing for laser bonding of ribbon connectors, especially conductive connectors used to provide current pathways for the operation of electronic or microelectronic components. In an alternative embodiment, the device is adapted for use with any material which absorbs the particular wavelength of the laser used. For example, the device may be used to bond non-conductive ribbons, i.e. plastic connectors such as may be used in packaging or other applications. In a further alternative embodiment, the invention may also be used to bond conductive connectors of alternative configurations, e.g. round wire. Preferably, a bonding device according to the present invention utilizes automation as developed for traditional wire and ribbon bonding, e.g. pattern-matching automation.

According to one embodiment of the invention, an automated pattern-matching bonder welds one end of an interconnection ribbon, the ribbon being fed from a spool of suitable interconnection ribbon. Subsequently, the bond head of the device moves to the second bond location as it spools out and forms the ribbon into the desired loop shape and then welds the second connection and terminates the ribbon. Alternatively, after formation of a second bond, additional ribbon may be spooled out to form one or more additional loop connectors, each loop terminating at a new weld connection. As an alternative to movement of the bond head, a machine table on which the work piece is mounted may move while the bond head remains stationary. The present invention has potential application for internal device interconnection, i.e., connections internal to an IC package, as well as final board assembly and other microelectronic connections. When bonding is effected according to the present invention, the choices for both ribbon and substrate materials increases, and the dependence on structural rigidity and terminal stability, as required for ultrasonic bonding, decreases or is eliminated.

Microelectronic bonding has enjoyed particularly useful application in the implantable medical device art, for example, as demonstrated in U.S. Pat. No. 5,535,097 to Ruben, et al. and U.S. Pat. No. 5,522,861 to Sikorski, et al., both assigned to the assignee of the instant application and both of which are hereby incorporated by reference. By way of example, the present invention may be used to make electrical connectors between and among the hybrid circuit, battery, capacitors, feedthroughs, and other components of implantable medical devices. In addition, however, it will be appreciated to those skilled in the art that the instant invention may be used in various microelectronic applications. These may include, but are not limited to, semiconductor production and chip utilization, integrated circuit packaging and mounting, and other electrical interconnections in the computer hardware and electronics industries.

BRIEF DESCRIPTIONS OF THE DRAWINGS

FIG. 2 is a plan view of an aspect of the ribbon bonding apparatus of FIG. 1.

FIG. 3 is an alternate plan view of an aspect of the apparatus of FIG. 2.

FIG. 4 is an alternate plan view of an aspect of the apparatus of FIG. 2.

DETAILED DESCRIPTION

Figure 1:
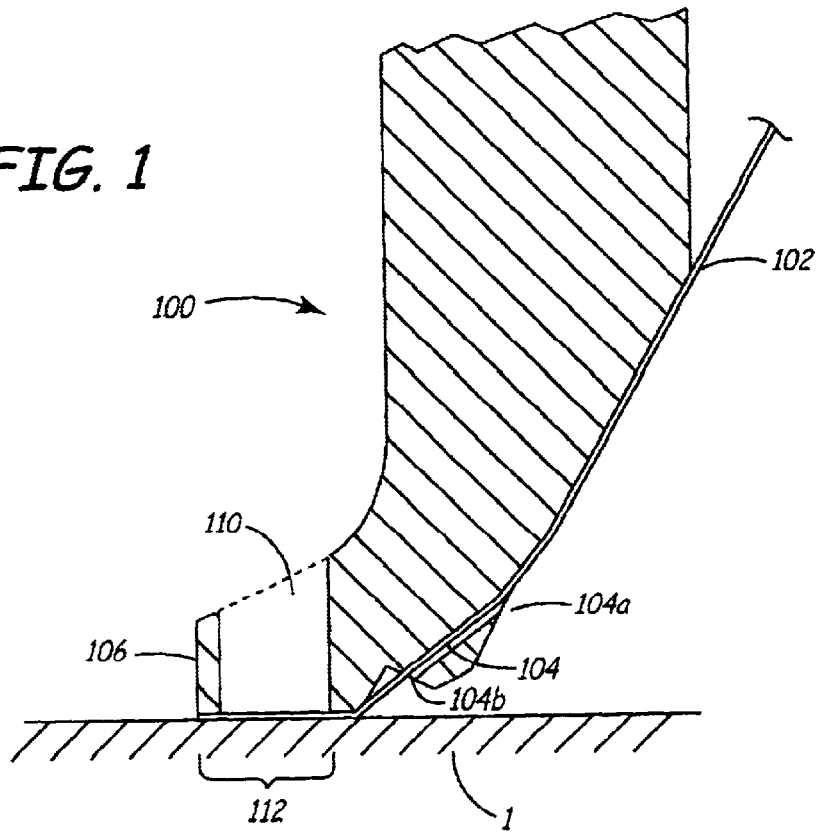
FIG. 1 is a cross-section of part of a ribbon bonding apparatus in accordance with a representative embodiment of the invention.

FIG. 1 depicts a cross-section of a portion of a ribbon bonding apparatus in accordance with a representative embodiment of the invention, the portion being a bond head 100. A ribbon 102, such as conductive metal ribbon, is supplied on a standard spool, depicted in a later figure. The bond head 100 is adapted to receive ribbon 102 through a threading slot 104. Threading slot 104 has a ribbon entrance 104a and ribbon exit 104b. The slot 104 is preferably adapted to admit ribbons of various thicknesses, e.g., 1 mil. From threading slot 104, ribbon 102 is disposed under bond foot 106, and may be welded to bond substrate 108 by a laser beam. In embodiments of the subject invention in which the laser is not directed by optic fiber to bond site through bond head 100, the bond head 100 may be adapted to have a laser aperture 110 to admit laser light that portion of ribbon 102 disposed over bond site 112. The ribbon may initially be threaded through threading slot 104 in bond head 100, to ensure proper placement of ribbon 102 relative to bond head 100. As described herein, the bond head descends to the bond surface and forces the ribbon to contact the substrate or component to be bonded, e.g., an IC bond pad. Once the predetermined load is applied, a laser may be fired in order to weld the ribbon 102 to the substrate 108 or other component.

Bond foot 106, as depicted in FIG. 1, is disposed at the bottom of bond foot 100, which is shown in plan view in FIG. 2. As shown in FIG. 2, laser aperture 110 is disposed approximately in the center of bond foot 106, which turns out from elongate bond head body 114. These features of bond head 100 are shown in greater detail in plan view in FIG. 3. The underside of bond head 100 and bond foot 106 is shown in FIG. 4. As can be seen in FIG. 4, laser aperture 110 is preferably substantially circular in shape, although other shapes suitable for passage of laser energy are possible. Ribbon threading slot 104 has threading slot entrance 104a, into which ribbon can enter from the back of bond head 100. Threading slot 104 also has threading slot exit 104b, from which ribbon may exit while ribbon is being spooled out in connection with loop formation, described herein.

Figure 5:
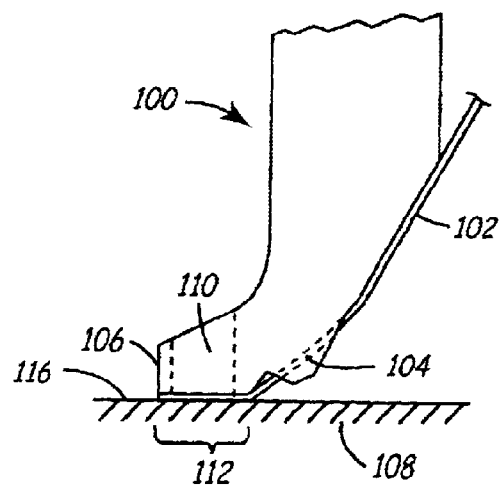

A process of connection loop formation according to an embodiment of the present invention is depicted in FIGS. 5–8. In a preferred embodiment of the invention, the bond head has several axes or modes of travel, for example, along an x-axis, y-axis, z-axis (vertically), and theta (rotation). By these various modes of travel as shown in FIG. 5, the bond head 106 may be positioned at a first bond site 112 upon bond surface 116. The bond head will first descend along the z-axis in order to contact the ribbon 102 to bond surface 116. Ribbon 102 is therefore disposed between bond foot 106 and bond surface 116, and thereby held in place. The ribbon 102 is fed through the bond tool ribbon threading slot 104 which holds ribbon 102 in place during bonding. Ribbon 102 may freely pass through ribbon threading slot 104 while bond head 100 travels between first and second or between subsequent bonds or welds. Upon placement of bond head 110 at a first bond site 112, a predetermined force is applied towards the bond site 112 by the bond head 110. In one embodiment, the bond head is adapted to receive an optic fiber through its length which allows the laser to fire directly at the point of the weld as depicted in later figures. A suitable laser beam is then fired, for example, through the aperture 110 on the bond foot 106, heating a portion of the ribbon 102 as well as the bond surface 116 above their respective solidus temperatures. A weld nugget, not depicted, is thus formed at the bond site 112, the nugget consisting of previously molten material of both the ribbon 102 and bond surface 116. The weld nugget created by the laser firing may be expected to form a bond of greater strength and reliability than solder or braze bonds.

Figure 8:
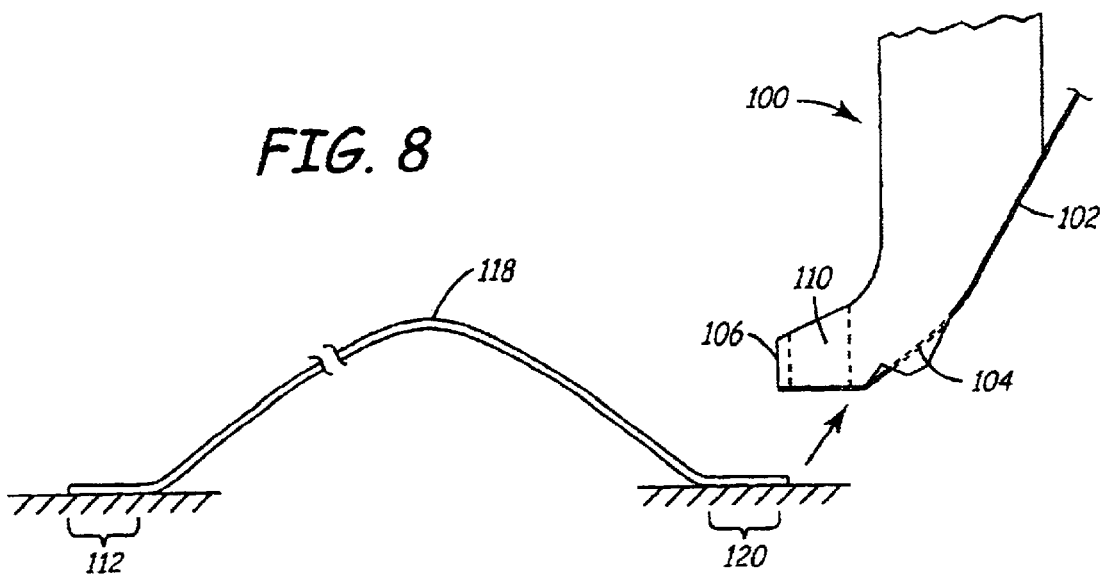
FIGS. 5–8 illustrate a method of bonding of a ribbon in accordance with an embodiment of the invention.
Figure 6:
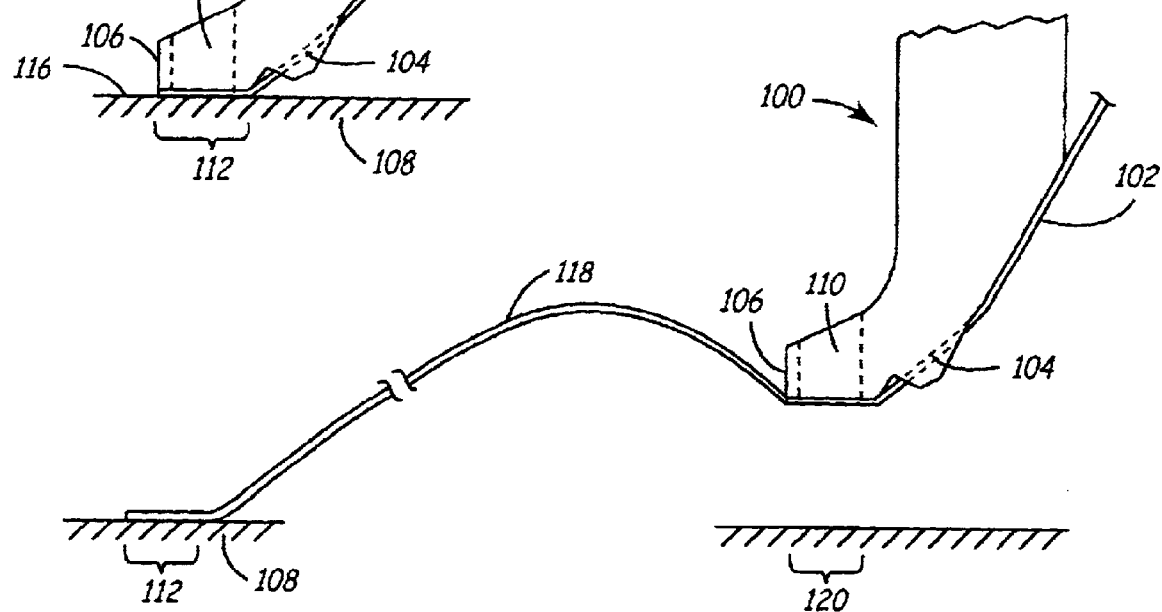
Figure 7:
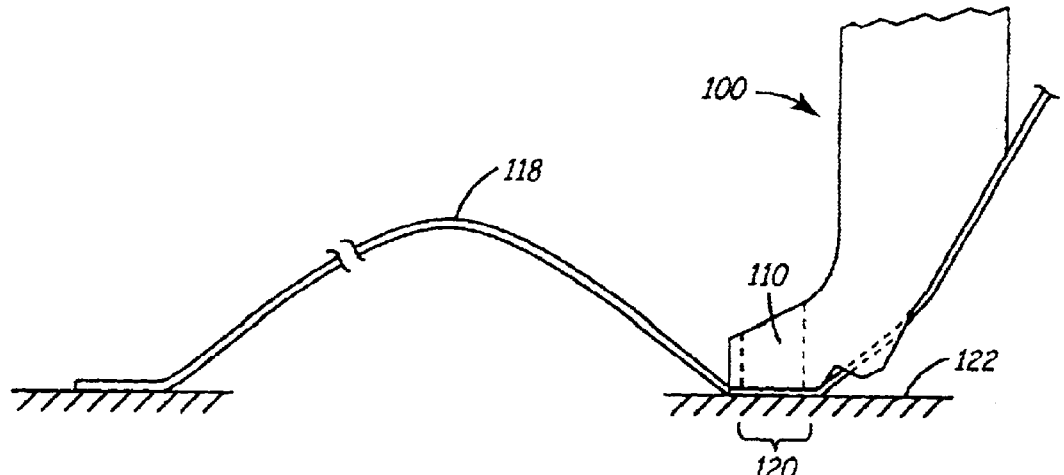

As shown in FIG. 6, following the initial bond as described above, or while the weld nugget of the initial bond is cooling, the bond head 100 may move to a second bond site 120, such as a programmed site, through an automated or otherwise predetermined trajectory adapted to spool out from bond head 100 a desired length of ribbon 102 to form loop 118. As shown in FIG. 7, upon contact with a second bond site 120, ribbon 102 is again disposed between bond foot 106 and bond surface 122, with a laser firing as before through laser aperture 110 to form a weld nugget at the bond site. Thereafter, further ribbon 102 may be spooled out from ribbon spool in order to form a connected second loop from a continuous length of ribbon. Alternatively, as shown in FIG. 8, ribbon 102 may be terminated by clamping of ribbon 102 above bond head 100 or by locking of the ribbon spool, not depicted. Following clamping of ribbon 102, bond head 100 is preferably moved in a manner leading to breaking of ribbon 102 in the vicinity of second bond site 120. In essence, ribbon 102 is terminated by head, table or clamp motions as is typical of existing methods of ultrasonic ribbon bonding. In a preferred embodiment, additional ribbon 102 is played out from a ribbon spool in order to be disposed under bond foot 106 for reinitiation of the bonding process as described above.

In an alternate embodiment of the invention, "security welds", i.e., double or other multiple welds may be effected at each bond site. These security welds serve to increase contact area for improved current flow, mechanical strength, and reliability. The bonder makes the weld, moves slightly and welds the ribbon again to the same terminal. The welds may overlap, may combine to form a single uniform weld nugget, or may be completely separate effecting discrete weld nuggets.

While typically described herein and with reference to FIGS. 5–8, as a movement of the bond head from a first bond site to a second bond site, as provided in a preferred embodiment, this bond head motion alternatively may be a relative motion only with regard to the work piece containing bond sites, a work table, or the like. In other words, what is generally termed the bond head motion may be one of or a combination of head, table or work piece movements vis-à-vis each other.

Figure 9:
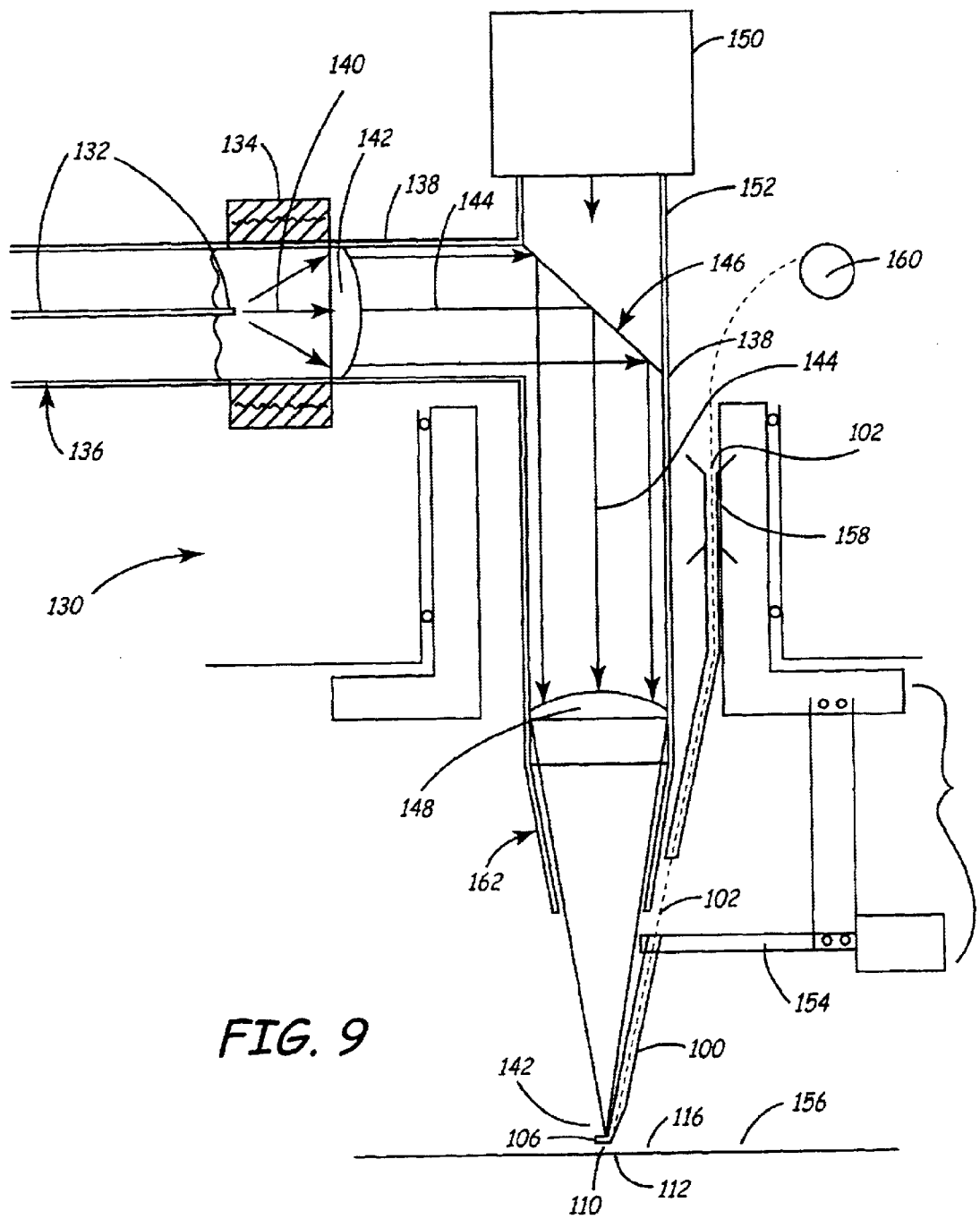
FIG. 9 is a cross-sectional view of a ribbon bonding apparatus according to the present invention.

In a representative embodiment of the subject invention and as depicted in FIG. 9, a laser beam may be directed at the bond site without passing through the entire length of bond head 110, thus allowing greater flexibility in motion of the bond head, particularly with regard to 2 (vertical) and theta mode movement (rotation). FIG. 9 depicts a cross section of a portion of a laser bonding apparatus 130 according to the present invention. As illustrated in FIG. 9, a preferred embodiment of the subject invention utilizes a laser, the beam 140 of which is delivered to the bond site 112 through a glass optic fiber 132 to a separate focusing head containing lenses and optics suitable for focusing the laser to bond site 112; thereby according full x, y, z, and theta mode movement to bond head 100 without attendant stress on a glass optic fiber 132 that would otherwise extend to bond foot 106 or bond tool 100.

It is believed that methods of laser delivery other than optic fiber running all the way to the bond head may reduce the possibility of certain occurrences such as fiber optic breakage, crimping or splintering of optic fiber 132. For example, as shown in FIG. 9, an optic fiber 132 may be directed towards the bond site 124, the optic fiber 132 being located within a separate arm or sheath 136. Because optic fiber 132 does not extend all the way to bond head 110, but only to optical fiber/laser housing connector 134, bond head 110 may be moved according to z (vertical) or theta (rotation) modes without resulting undue stress on optic fiber 132. Connector 134 joins optic fiber sheath 136 with laser path housing 138. The laser light beam 140 may be directed at the bond site 124 in a way in which the laser beam is unfocused and consists substantially of light beams traveling parallel to each other. In an alternate embodiment, the laser may be focused, for example, by the use of a lens. In this embodiment of the invention, the focus point 142 of the laser beam 140 may be placed directly at or adjacent the bond site 112, for example, at the top surface of the ribbon, at the bond surface 116 or slightly below the bond surface 116.

Optic fiber 132 may introduce laser beam 140 to collimating lens 142, having the effect of spreading out the laser beam into a broader beam. Collimated beam 144 then proceeds to dichroic mirror 146, where the beam is directed 90 degrees downward towards bond site 124. Broad beam 144 may be focused by focusing lens 148, in order to supply a laser focus point 142 at the surface of or at some depth of bond site 124 according to the desired heating effect.

By use of dichroic mirror 146, broad collimated laser beam 140 may be reflected toward bond site 124. However, camera 150 or other visual sighting accommodation such as an eyepiece for direct viewing may be adapted at top of housing tube 152, in order to afford viewing for process monitoring, and if desired, other user operations such as manual alignment of focused laser beam 142 through laser aperture 110 and/or manual placement of bond head 100 to desired bond site, e.g., bond site 112.

In a preferred embodiment of the subject invention, bond head 110 and bond head arm 154 may be moved within certain modes of movement, such as x, y, z and theta (rotation) modes, without corresponding or attendant movement of laser housing 138. Primarily, for example, user may wish to effect movement of bond head 100 and bond arm 154 within the z mode (horizontal or "up and down" movement of the bond head), or theta mode (rotation of bond head 100 relative to bond site 112 or work piece 156 without moving laser housing 138. In one embodiment of the subject invention, while z mode and theta mode bond head movement is independent of movement of laser housing 138, movement of bond head 100 according to x and y modes (i.e., planar movement of the bond head along the plane of the work piece) corresponds to an equal movement along the respective x and y mode of laser housing 138. In other words, in one embodiment laser housing 138 moves in concert with bond head 100 and bond arm 154 in order to maintain vertical alignment of laser focus point 142 with laser aperture 110 of bond head 100.

In an embodiment of the present invention in which laser housing 138 may be moved independently from bond arm 154, preferably z mode vertical movement of bond head 100 away from bond site 112 will generally be effected only at times when laser beam 140 is not firing. These times generally will be during loop formation, i.e., during the period when ribbon clamp 158 is open, allowing ribbon 102 to feed from spool 160 while ribbon 102 is anchored to a first bond site such as bond site 112 of FIG. 6 and being thus anchored is drawn from spool 160 due to bond head 100 movement away from first bond site 124, with subsequent termination of bond loop 118 upon bonding of second bond site 120 as depicted in FIG. 7. In one embodiment of the present invention, an inert cover gas, e.g. helium, argon, or nitrogen is disposed through gas nozzle 162 by jetting over the bond site in order to prevent oxidation or discoloration of bonded ribbon 102, bond site 112 or the weld nugget. Inert gas jet from gas nozzle 162 also serves to keep lens 148 free of vapors and debris.

The bond head 100 may be configured in alternate ways in order to deliver laser beam energy to the bond site. For example, optic fiber 132 may extend directly through bond head 100 and bond foot 106 to bond site 112. The optic fiber 132 may be completely embedded within bond head 100, Alternatively, the optic fiber 132 may be free of bond head 100 until entering bond foot 106 in a position corresponding to laser aperture 110 of bond foot 106.

In any of various embodiments of the subject invention, a Nd:YAG 355–1,064 nm laser may be used. Generally, however, the laser source to effect the bonding may be a high power pulsed or continuous wave (CW) laser, e.g. NdYAG, Ar-ion, Carbon dioxide, or Cu vapor. For example, a suitable laser may be a NdYAG Pulsed Laser output of 1 joule/pulse, with a pulse width of 1–5 msec, and a pulse strength of 1000–2000 watts. The power required to generate the required heat is thought typically to be 1–10 watts or more of average power. (A 1 msec, 1000 watt pulse every second would be equivalent to 1 watt of CW operation.) In certain embodiments of the present invention, according to FIG. 9, for example, configured with a carbon dioxide laser, a laser beam may be provided to laser housing 138 directly from a laser beam generator (not depicted) without the use of optic fiber.

In addition to ribbon bonding loops between bond pads as described above, this bonding system can also be used to make solder or braze connections between ribbons and substrates. The solder or braze material may already be on the ribbon or substrate or may be an alloy formed during the joining operation. High or low temperature solders and brazes can be used even on temperature sensitive substrates. Because of the very localized heat imparted by laser beam 140, damage to underlying and adjacent materials is avoided.

The bonder could be made as a fully automatic, semi-automatic or manual machine. The difference among these applications would lie primarily in the use of programmability and pattern recognition features, as are currently available in ultrasonic bonding machines of the prior art. The table, ribbon feed and pattern recognition system of an automatic ultrasonic ribbon bonder may be utilized to implement an embodiment of the subject invention. Accordingly, the present invention may be implemented, in certain embodiments, by modification of existing bonding tables and other bonding equipment utilizing automation techniques of circuit manufacture, such as pattern-matching and machine vision technologies. For example, bonding head parts and assemblies are available from various manufacturers, such as Orthodyne Electronics, of Irvine, Calif.; MicroJoin, Inc. (formerly Hughes/Palomar Technologies) of Poway, Calif.; Verity Instruments, Inc., of Carrollton, Tex.; Kulicke & Soffa Industries, Inc. of Willow Grove, Pa.; and F & K Delvotec of Foothill Ranch, Calif. For example, Orthodyne Model 360S Small Wire Bonder or the Delvotec 6400 bonder are thought to provide suitable base units that may provide basic bonding automation functions such as those that may be utilized in accordance with the present invention.

In a preferred embodiment of the subject invention, the laser bonding process as described is automated. For example, a device may be presented to the bonder by manual placement on a work holder or automatically by a conveyor system. The position of the device may be determined by pattern recognition, as is known in the art. Preferably, pattern recognition systems and motion algorithms automatically compensate for variations in positions of the bond sites within the various assemblies in order to provide automation of the bonding process. It is believed that, in accordance with a preferred embodiment of the subject invention, throughput of at least one ribbon connection per second may be achieved; equating with two laser firings per second.

In one embodiment of the present invention, the above method may be used to bond a nickel-clad copper ribbon 0.002 inches×0.015 inches (2×15 mils). In alternate embodiments of the subject method, ribbons of Pt, Ni 205, Ni 270, and Al 6061 may be laser bonded using the above method. In any embodiment of the invention, materials must adsorb sufficient light from the laser such that their heat is increased above solidus. Certain highly reflective materials may not absorb sufficient laser light to effect sufficient heat rise.

It will be appreciated that the present invention, in various embodiments, can be used for soldering, brazing and welding a wider range of materials than possible with resistance welding, ultrasonic welding or soldering alone. It is anticipated that bonds and connections effected according to the instant invention, particularly when effected as security welds, will be highly robust and reliable, and will be significantly more robust and offer a reduced error rate in comparison to existing automated bonding methods.

It is believed that a wide variety of connection materials may be suitably bonded by the present invention in one of various embodiments. For example, copper, gold or other ribbon materials could be used. It is anticipated that this will prove particularly useful for non-rigid structures, which are prone to vibration during ultrasonic processes of the prior art. In contrast to bonding systems of the prior art, the present invention requires no special fixation or holding methods or apparatus to hold components in order to eliminate vibration during bonding, because there is no ultrasonic energy to be imparted to the parts to be joined.

In further contrast to existing methods of conductive connection bonding, the present invention provides a method of bonding with limited equipment wear and deterioration. For example, ultrasonic bonding equipment, especially for ultrasonic frequencies exceeding 100 KHz, is subject to bond head deterioration resulting from the extreme vibration and frictional forces endured by the bond head. Similarly, resistance welding equipment is subject to electrode wear or oxidation. Furthermore, unlike resistance welding, the present invention admits of bonding low resistance metals such as copper and gold. Gold or copper ribbons are commercially available and preferred for their low resistance, good looping characteristics and corrosion resistance. However, other materials such as nickel and silver could also be welded.

While a preferred embodiment of the present invention has been described, it will be appreciated by those skilled in the art that various changes, adaptations and modifications may be made therein without departing from the spirit of the invention and the scope of the appended claims.

What is claimed is:

1. A method for bonding of ribbon to a first substrate, comprising:

disposing a segment of an elongated laser-weldable ribbon through a threading aperture of a bond head, wherein said threading aperture comprises structure constraining lateral movement of the elongated laser-weldable ribbon, and wherein a portion of said elongated laser-weldable ribbon passes between an articulated bond head and a first substrate, and wherein an aperture formed in the articulated bond head is adapted to permit passage of a laser beam therethrough;

aiming a laser beam source so that the laser beam passes through the aperture and impinges upon a portion of the elongated laser-weldable ribbon; and firing the laser beam source for a predetermined time sufficient to form a first weld nugget at a first bond site, the first weld nugget consisting of material from both the elongated laser-weldable ribbon and the first substrate.

2. A method according to claim 1, wherein the laser beam is focused adjacent the bond site.

3. A method according to claim 1, wherein the elongated laser-weldable ribbon is an electrically conductive material having a geometric cross-sectional shape, a round cross-sectional shape, an elongated cross-sectional shape or a substantially rectangular cross-sectional shape.

4. A method according to claim 1, wherein the elongated laser-weldable ribbon comprises at least a one of the group: nickel-clad copper, platinum, nickel 505, nickel 270, aluminum 6061.

5. The method of claim 1, wherein the laser beam source operates either in a pulsed mode or in a continuous wave mode.

6. A method according to claim 1, wherein said laser beam source is a neodymium yttrium aluminum garnate laser source, an argon-ion laser source, a carbon dioxide laser source, or a copper vapor laser source.

7. A method according to claim 1, further comprising the steps of:

moving the articulated bond head relative to a work piece to position the articulated bond head adjacent to a second bond site disposed on a second substrate while playing out the elongated laser-weldable ribbon from a ribbon spool;

disposing the elongated laser-weldable ribbon between the articulated bond head and the second substrate;

aiming the laser beam source so that the laser beam passes through the aperture and impinges upon the elongated laser-weldable ribbon; and firing the laser beam source for a predetermined time sufficient to form a second weld nugget at the second bond site, the second weld nugget consisting of material from both the elongated laser-weldable ribbon and the second substrate.

8. The method of claim 7, further comprising the additional step of severing the elongated laser-weldable ribbon adjacent the second bond site.

9. The method of claim 8, wherein the elongated laser-weldable ribbon is severed by the articulated bond head to form a wedge bond.

10. The method of claim 1, further comprising the steps of:

moving the articulated bond head horizontally, vertically or radially with respect to a location proximate to the first bond site, and firing the laser for an additional predetermined time sufficient to form a security weld.

11. An apparatus for bonding a section of laser-weldable ribbon to at least one substrate pad, comprising:

a laser beam generator;

a bond foot moveable with respect to the laser beam generator and having an aperture formed through a portion of said bond foot for passage of a laser beam emitted from the laser beam generator therethrough;

aiming means for directing the laser beam to a bond site; and a ribbon-pathway means for smoothly deploying a length of elongated laser-weldable ribbon material from a ribbon source to a position adjacent the aperture.

12. An apparatus according to claim 11, wherein the ribbon source comprises a portion of elongated laser-weldable ribbon disposed upon a reciprocating ribbon-storing spool; and further comprising means for preventing the uncontrolled release of the portion of ribbon from the ribbon-storing spool.

13. An apparatus according to claim 12, wherein the preventing means comprises a mechanical clamp.

14. An apparatus according to claim 13, wherein the ribbon-pathway means further comprises structure disposed on opposing sides of a ribbon pathway to restrain the elongated laser-weldable ribbon from moving laterally relative to a major longitudinal axis of said elongated laser-weldable ribbon.

15. An apparatus according to claim 11, further comprising magnification means adapted for visually magnifying a region, said region including at least a portion of the bond site.

16. An apparatus according to claim 15, wherein the magnification means further comprises at least one magnifying lens coupled to a part of the apparatus and disposed adjacent a mirror directing the laser beam to the bond site and wherein the magnifying lens and the mirror have different optical paths to the bond site.

17. An apparatus according to claim 11, wherein the aiming means further comprises an optic fiber coupled to the laser beam generator at a proximal end and having a portion disposed in the aperture of the bond foot and wherein a distal end terminates adjacent the bond site.

18. The apparatus of claim 17, wherein the optic fiber adjacent the bond head is firmly coupled to a portion of the bond head.

19. An apparatus according to claim 11, wherein the laser beam generator is a one of the following: a neodymium yttrium aluminum garnate, an argon-ion, a carbon dioxide, or a copper vapor laser beam generator.

20. An apparatus according to claim 11, further comprising a means for articulating the bond head relative to the bond site.

21. A bonding apparatus for connecting a segment of a ribbon to at least one substrate pad member that is coupled to a stationary, substantially unconstrained work piece to form a bond connection at a bond site, the apparatus comprising:

a stationary laser beam source;

a pedestal moveable with respect to the stationary laser beam source and including a bond foot with an aperture for admitting a laser beam emanating from the laser beam source and a ribbon alignment means for positioning a ribbon between the bond site and the bond foot such that a part of the ribbon aligned with said aperture; and an aiming structure to direct the laser beam at the bond site;

wherein said ribbon alignment means further comprises structure disposed on at least one side of a predetermined ribbon pathway to constrain a portion of ribbon from twisting or slipping out registration of said predetermined ribbon pathway.

* * * * *